United States Patent [19]

Baliga

[11] Patent Number: 5,021,861
[45] Date of Patent: Jun. 4, 1991

[54] INTEGRATED CIRCUIT POWER DEVICE WITH AUTOMATIC REMOVAL OF DEFECTIVE DEVICES AND METHOD OF FABRICATING SAME

[75] Inventor: Bantval J. Baliga, Raleigh, N.C.

[73] Assignee: North Carolina State University, Raleigh, N.C.

[21] Appl. No.: 527,747

[22] Filed: May 23, 1990

[51] Int. Cl.[5] .................... H01L 27/02; H01L 27/01; H01L 29/00; H03K 19/173
[52] U.S. Cl. .................................. 357/51; 357/23.1; 357/41; 307/465
[58] Field of Search .................... 357/51, 41, 23.1; 307/465

[56] References Cited

U.S. PATENT DOCUMENTS

| | | | |
|---|---|---|---|
| 4,387,503 | 6/1983 | Aswell et al. | 29/575 |
| 4,543,594 | 9/1985 | Mohsen et al. | 357/51 |
| 4,605,872 | 8/1986 | Rung | 307/465 |
| 4,771,471 | 10/1988 | Comer | 341/118 |
| 4,799,126 | 1/1989 | Kruse et al. | 361/101 |
| 4,860,185 | 8/1989 | Brewer et al. | 363/41 |
| 4,885,477 | 12/1989 | Bird et al. | 307/296.8 |
| 4,894,791 | 1/1990 | Jiang et al. | 364/570 |
| 4,910,508 | 3/1990 | Yamazaki | 340/825.9 |

OTHER PUBLICATIONS

A large Area MOS-GTO With Wafer Repair Technique, M. Stoisiek, M. Beyer, W. Kiffe, H. J. Schultz, H. Schmid, H. Schwarzbauer, R. Stengl, P. Turkes, D. Theis, 666-*IEDM*, 1987, pp. 666–669.

*Modern Power Devices*, B. J. Baliga, Power Metal-Oxide-Semiconductor Field-Effect Transistors, 1987, pp. 263–343.

Functional Integration of Power MOS and Bipolar Devices, J. Tihanyi, 1980 *IEEE*, pp. 75–78.

*Primary Examiner*—Andrew J. James
*Assistant Examiner*—Cynthia S. Deal
*Attorney, Agent, or Firm*—Bell, Seltzer, Park & Gibson

[57] ABSTRACT

An integrated circuit power device is disclosed having a large number of individual devices formed in an integrated circuit. Disabling devices are provided in the integrated circuit, a respective one of which is electrically connected to an associated one or more of the individual devices. Each of the disabling devices is responsive to a defect in the associated one or more individual devices, such as a short circuit, for automatically disabling the associated one or more individual devices. An operable integrated circuit power device is obtained, notwithstanding a defective one or more of the individual devices. Testing of individual devices, or customized mask generation is not necessary. In a preferred embodiment, the disabling device is a fusible link formed of a low melting point conductor. In response to the initial powering up of the device or in response to a gate pulse, all fusible links associated with short circuited individual devices will melt, thereby insulating the remainder of the devices from the short circuit.

12 Claims, 2 Drawing Sheets

INTEGRATED CIRCUIT POWER DEVICE WITH AUTOMATIC REMOVAL OF DEFECTIVE DEVICES AND METHOD OF FABRICATING SAME

FIELD OF THE INVENTION

This invention relates to semiconductor devices, and more particularly to integrated circuit semiconductor power devices and methods for fabricating such devices.

BACKGROUND OF THE INVENTION

Power devices have been widely used to carry large currents at high voltages. The problems with these devices included their large size and unreliability. However, in the early 1950's, developers of electronic power systems began to base their high power systems on semiconductor devices.

Many of these early semiconductor power devices included a single large device for handling large currents; e.g., a thyristor or rectifier. By the 1970's, devices were fabricated capable of operating at up to 3,000 volts and controlling 1,000 amperes of current. Other types of devices have also been fabricated which are adapted to carry large currents and voltages by connecting many small discrete devices, such as bipolar devices, in parallel. The bipolar devices were first developed in the early 1950's. Today it is possible to fabricate bipolar transistors with a current handling capability of several hundred amperes and a block voltage of 600 volts.

Bipolar transistors, however, have several major problems in their operation. For example, a high current is required to control the bipolar transistor, typically one-fifth to one-tenth of the collector current. Consequently, the base drive circuitry contains many intricate and expensive components. Bipolar transistors are also subject to a breakdown failure when high current and voltage are simultaneously applied to the device as required in inductive power circuits. Metal Oxide Semiconductor (MOS)-gated devices were suggested to solve these problems.

The MOS-gated power device overcomes many of the problems of bipolar devices. The control signal of a MOS-gated device is connected to a metal gate electrode that is separated from the semiconductor surface by an intervening insulator, typically silicon dioxide. Accordingly, MOS-gated devices have a high input impedance which allows for simpler gate drive circuitry and cost reduction within the power electronics. The power MOSFETs' switching speed is many orders of magnitude faster than the switching speed for bipolar transistors, thus making MOSFETs particularly suitable in high frequency circuits where switching power losses are frequent.

In many present day power devices, large numbers of parallel-connected individual bipolar, MOS or other devices, commonly referred to as "cells", are fabricated in parallel in a single semiconductor integrated circuit, using well known microelectronic manufacturing techniques. Presently, up to 100,000 or more individual low current MOS-gated cells may be fabricated in parallel to produce a power device.

A major concern in fabricating a high current power device containing a large number of parallel cells is the yield of the resulting chip. In particular, it is difficult to provide a high yield high current power device in view of the defect rate of the individual cells on the semiconductor substrate. Since these individual cells are electrically connected parallel to one another, a short circuit in one cell renders the power device unusable. Accordingly, in practice, yields of only 30% are typically obtained even for relatively small chips with size of 0.25 inch by 0.25 inch.

One attempt at overcoming this yield problem is described in the article "A Large Area MOS-GTO with Wafer-repair Technique" by Stoisiek, et al., IEDM, 1987, pages 666-669. In this approach a MOS power device is fabricated out of about 300,000 individual MOS cells on a semiconductor substrate. The individual MOS cells are grouped into cell blocks, and each cell block is individually tested for faulty operation. The substrate is covered with an insulating layer, and via hole pattern is etched into the insulating layer according to the results of the previous operational measurements, i.e. holes are etched only over the cell blocks without a fault. Consequently, the faulty cell blocks are insulated from the rest of the device. A metal layer connects all the operational cell blocks through the via holes. Thus, shorted cells are prevented from causing other cells to short circuit because they are not connected in parallel with the functional cells.

While the above described technique prevents a short circuit in one or more individual cell blocks from destroying the entire power device, this technique is not amenable to mass production of power devices. Each individual cell block must be tested for shorts, which is a time consuming process. Once shorts are identified, a custom mask must be designed for every wafer so that a via hole pattern may be etched on the insulating layer to connect only the fault-free cells or cell blocks. The cost of individual masks and the turn around time for designing the masks and then forming the individually designed via patterns makes the resultant devices prohibitively expensive. In addition, these operations increase the number of processing steps and add to overall fabrication cost for the large area device.

SUMMARY OF THE INVENTION

It is therefore an object of the present invention to provide improved integrated circuit power devices, and a method of fabricating such devices.

It is yet another object of the present invention to provide an integrated circuit power device structure and fabrication method which obtain a high yield.

It is still another object of the present invention to provide a low cost integrated circuit power device structure and fabrication method.

These and other objects are accomplished according to the present invention in an integrated circuit power device, such as a MOS-gated power device, having a large number of individual cells, by providing automatic disabling means in the integrated circuit, a respective one of which is electrically connected to an associated one or more of the individual cells. Each of the disabling means is responsive to a defect in the associated one or more individual cells, such as a short circuit, for automatically disabling the associated one or more individual cells. An operable integrated circuit power device is thereby obtained, notwithstanding a defective one or more of the individual cells. Testing of individual cells, or customized mask generation is not necessary.

In one embodiment, the automatic disabling means are electrically connected between the associated one or more individual cells and a common electrode for the power device. In response to a short circuit, the associated one or more individual cells are automatically disconnected from the common electrode.

The disabling means of the present invention may comprise an electronic logic circuit such as a latching circuit. However, in a preferred embodiment, the disabling means is a fusible link formed of a low melting point conductor. A fusible link may connect each individual cell, or each group of individual cells (cell block), to a common electrode of the power device. For example, in a MOS-gated device, a fusible link connects the gate electrode of the power device to the common gate of each cell block. The fusible link is designed to melt in response to a defect related short circuit current in the associated individual cell or cell block. Accordingly, when the power device is initially powered, all fusible links associated with short circuited individual cells will melt, so that the cell or cell block containing the defective cell is disconnected. Individual cell block testing and custom masks are therefore not required.

DETAILED DESCRIPTION OF THE INVENTION

The present invention will now be described more fully hereinafter with reference to the accompanying drawings, in which a preferred embodiment of the invention is shown. This invention may, however, be embodied in many different forms and should not be construed as limited to the embodiment set forth herein; rather, Applicant provides this embodiment so that this disclosure will be thorough and complete, and will fully convey the scope of the invention to those skilled in the art.

Like characters refer to like elements throughout. For greater clarity, the size of the elements has been exaggerated.

Figure 1:
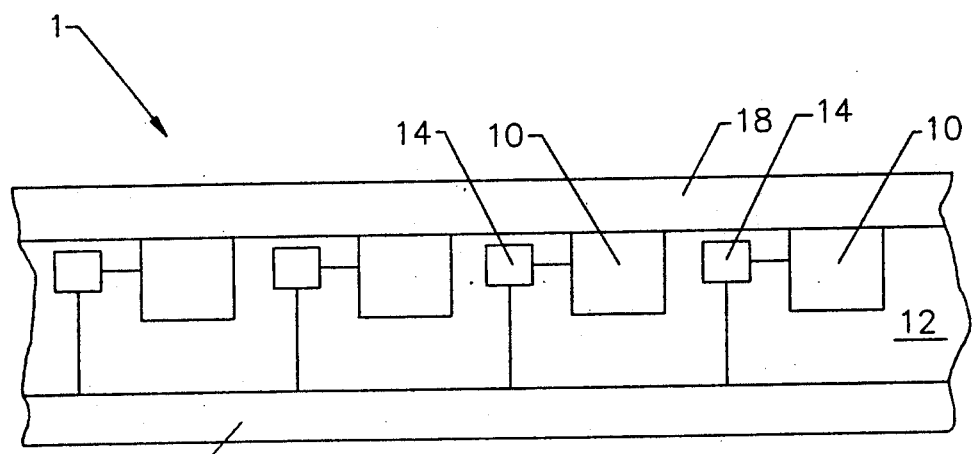
FIG. 1 is a schematic block diagram of an integrated circuit power device of the present invention.

Referring now to FIG. 1, a schematic view of an integrated circuit power device according to the present invention is shown. Integrated circuit power device 1 includes a large number of individual cells 10 which are formed in a substrate 12. Substrate 12 is typically monocrystalline silicon, but other semiconductor substrates may be used. Each individual device 10 is connected to a common output 18. Typically, a second common output (not shown) may also be provided. A common control or gate input electrode 16 may also be provided. The individual cells 10 may be metal oxide semiconductor-gated devices (MOS-gated devices) such as MOS Coupled Transistors (MCT's) or Insulated Gate Bipolar Transistors (IGBT's), or other devices. When MOS-gated devices are used, the first common output 18 is typically a source output, the second common output is the drain output and the control electrode 16 is the gate input. However, it will be understood that other devices such as bipolar devices will have other configurations.

According to the invention, each individual cell 10 is connected to the gate input electrode 16 via a disabling means 14. It will be understood that a group of individual cells (i.e. a cell block) may also be connected to one disabling means. The disabling means senses a defect in the associated cell or group of devices (cell block) and automatically disables the associated device(s), for example, by disconnecting the defective devices from the common gate electrode 16. Individual testing and custom masks are not required. It will be understood by those having skill in the art that the disabling means 14 need not be connected to cells 10 via electrode 16. In fact, the disabling means need not be connected to any electrode at all.

The disabling means 14 may be in the form of an electronic latch circuit. However, the formation of individual latch circuits for each individual device 10 or group of devices may require extra process steps and may consume valuable "real estate." Therefore, the preferred embodiment of the invention calls for the use of fusible links as the disabling means.

Figure 2:
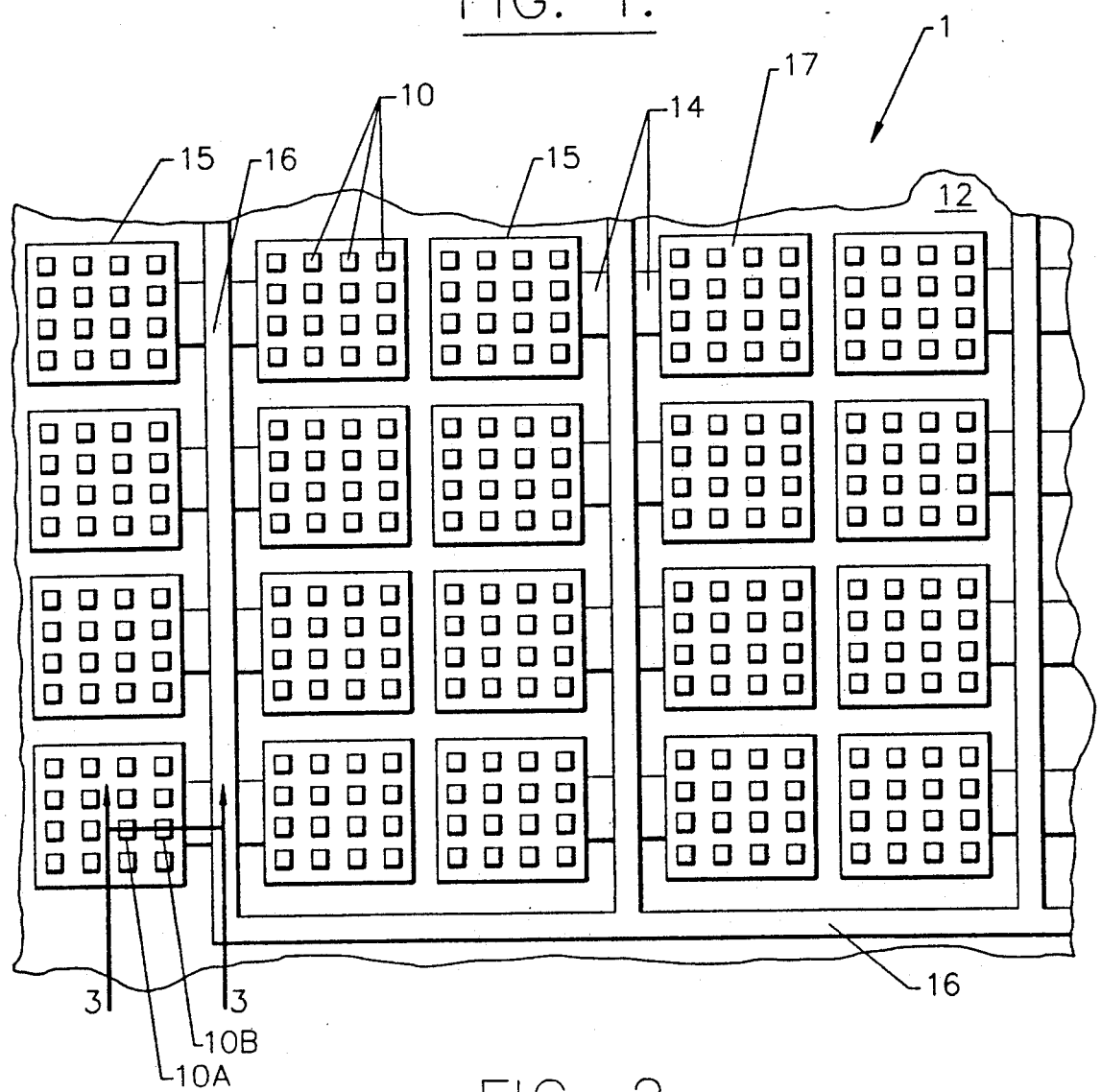
FIG. 2 is a top view of an integrated circuit power device embodying the present invention.

Referring now to FIG. 2, a block diagram of an integrated power MOSFET device 1 with fusible links between partitioned groups or blocks of active cell blocks 15 is shown. An array of individual cells 10 are grouped into cell blocks 15. The top surface 17 of the cell block 15 is the gate which is typically polysilicon. The polysilicon gate region 17 of the cell blocks are connected to a common gate electrode 16 through fusible links 14. Fusible links 14 are designed to melt when power is supplied to the gate electrode 16 if a short circuit is present in any cell 10 in the associated cell block 15. The associated cell or cell block is thereby removed from the connection to the gate electrode.

It will be understood by those having skill in the art that in order to provide a margin of safety, fusible links 14 may be designed to melt upon application of a high current, limited voltage gate pulse that will not damage the gate oxide. For example, a pulse of 0.1 amperes, at 20 volts for a duration of 0.1 seconds may be applied. Upon application of the pulse, those cell blocks having a short circuit between a gate and the source/drain will allow the gate current to pass through the associated fusible link, thereby melting the fusible link. This eliminates connection to defective cell blocks automatically without the need to find their location during testing.

Figure 3A:
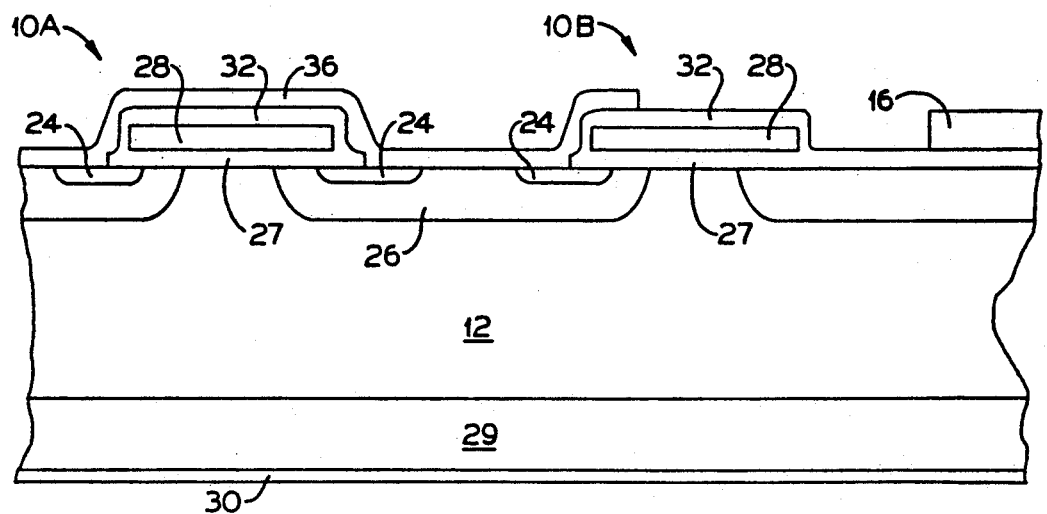
FIGS. 3A–3C are detailed cross-sectional drawings illustrating a method of fabricating the power device of FIG. 2, taken along line 3—3 of FIG. 2.
Figure 3B:
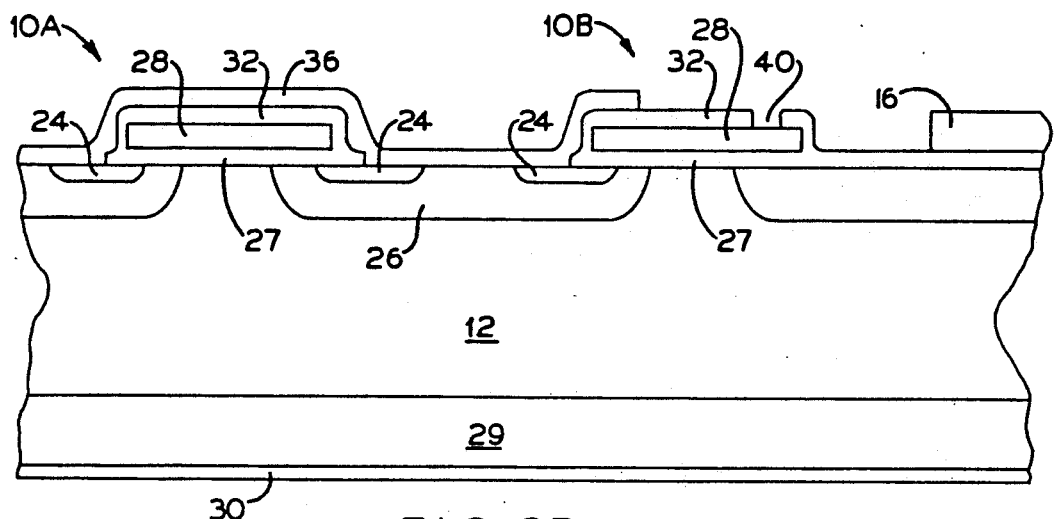
Figure 3C:
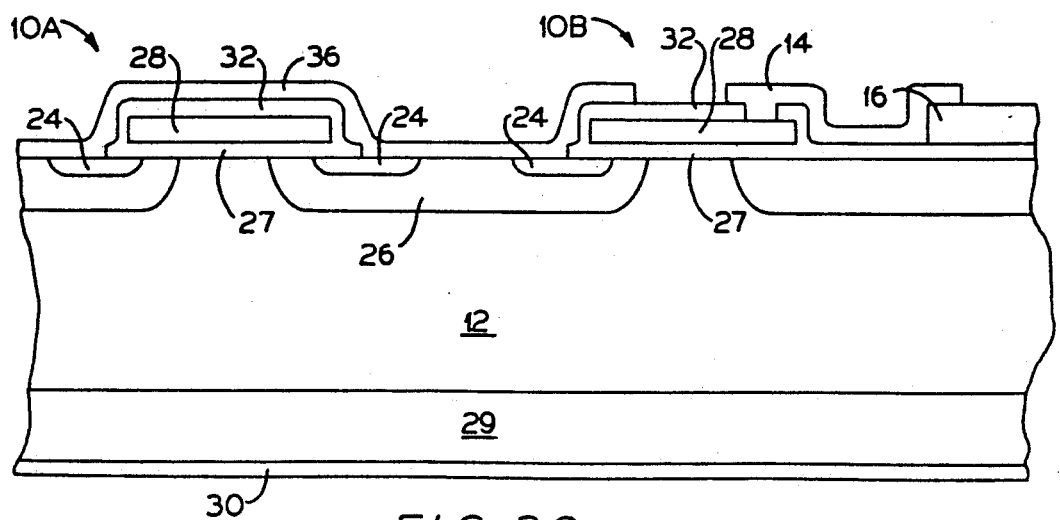

A method of fabricating an integrated circuit power device using fusible link disabling means is described in FIGS. 3A–3C.

Referring now to FIG. 3A, two individual devices 10 in the form of MOS-gated devices 10A and 10B are shown formed in semiconductor substrate 12. These devices represent two adjacent cells at the end of a cell block 15 as indicated by line 3—3 in FIG. 2. These MOS-gated devices 10 are in the form of metal oxide semiconductor field effect transistors (MOSFETs). The source 24 is typically doped N+. The base region 26 is typically a P-type doped region and driven deeper than the N+ source 24. The difference in lateral diffusion between the P-type base 26 and the N+ source 24 region defines a surface channel region.

An oxide layer 27, typically 0.1 μm thick, is formed on the substrate by thermal oxidation or other well known techniques. A gate 28 is then formed on oxide 27, using polysilicon, and is doped N-type at a high concentration. The drain 29 appears at the opposite face of the substrate 12 from the source 24. A drain contact 30 is fabricated on the bottom face of the semiconductor substrate 12, to connect all drains together. The structure and fabrication steps for power devices 10 are described in the textbook entitled "Modern Power Devices" by B. J. Baliga, published in 1987 by John Wiley and Sons, the disclosure of which is hereby incorporated herein by reference.

After the individual cells 10 are formed in the semiconductor substrate 12, an oxide layer 32 is formed on the polysilicon gate 28 as seen in FIG. 3A. The oxide layer 32 may be approximately 1.0 μm thick and may be formed by deposition or other conventional techniques.

Next, a metal layer 36, for example, aluminum, is evaporated or deposited on oxide layer 32 as depicted in FIG. 3A. Thus, the sources 24 are connected to the metal layer 36. This layer 36 serves as a common source contact for individual cells 10. At the same time, gate electrode 16 is formed on oxide layer 32. As shown in FIG. 3A, gate electrode 16 is not yet connected to the individual cells. It will also be understood by those having skill in the art that layers 36 and 16 may be formed in separate fabrication steps.

Referring now to FIG. 3B, one or more apertures 40 are anisotropically etched above the gate region 28 of the cell block so as to expose the gate region. Then, referring to FIG. 3C, fusible link 14 is formed to connect gate electrode 16 and gate 28. The fusible link 14 may be formed of any low melting point metal such as aluminum. The link may be formed by deposition, evaporation, or other well known techniques. In operation, when the device is initially powered or in response to a gate pulse, all fusible links 14 associated with short circuited individual cell blocks 15 will melt, so that the cell blocks 15 containing defective cells are disconnected and cannot trigger an avalanche short circuit of all individual cells.

In structuring the power device of the present invention, consideration should be given to the yield from each cell block. For example, in a typical cell block of 50 mils×50 mils, the yield is 95 percent. If cell blocks of this type are arranged in a power device of 1 inch×1 inch (i.e., containing 400 50 mils×50 mils cell blocks) according to the present invention, the yield of the power device would still be 100 percent because any short circuits of individual cells within the device are isolated. In contrast, in prior art devices, the yield in a typical power device of 1 inch×1 inch (i.e., containing 400 50 mils×50 mils cell blocks) will be virtually zero since nothing isolates the gate to source/drain short circuits. According to the invention, if the yield of the individual cell blocks is 95%, the power device will have 95% useable area for current conduction after the isolation of the defective cell blocks.

In summary, a high yield power device is disclosed having a large number of individual devices formed in an integrated circuit by providing automatic disabling means in the integrated circuit, a respective one of which is electrically connected to an associated one or more of the individual devices. Each of the disabling devices is responsive to a defect in the associated one or more individual devices. An operable integrated circuit power device is thereby obtained, notwithstanding a defective one or more of the individual devices.

In the drawings and specification, there have been disclosed typical preferred embodiments of the invention and, although specific terms are employed, they are used in a generic and descriptive sense only and not for purposes of limitation, the scope of the invention being set forth in the following claims.

That which We claim is:

1. A power device comprising:
   an integrated circuit;
   a plurality of individual devices formed in said integrated circuit, electrically connected in parallel, the individual devices each handling a relatively small current so that said plurality of individual devices electrically connected in parallel handle a relatively large current, to thereby provide an integrated circuit power device; and,
   a plurality of defect responsive automatic disabling means formed in said integrated circuit, a respective one of which is electrically connected to an associated at least one of said individual devices, each of said defect responsive automatic disabling means being responsive to a defect in the associated individual devices for automatically disabling the associated individual devices;
   whereby an operable integrated circuit power device is obtained notwithstanding a defect in the individual power devices thereof.

2. The power device of claim 1 further comprising a common electrode in said integrated circuit; said plurality of defect responsive automatic disabling means being electrically connected between the associated individual devices and said common electrode, for electrically disconnecting the associated individual devices from said common electrode in response to a defect in the associated individual devices.

3. The power device of claim 1 wherein said defect responsive automatic disabling means comprises a fusible link.

4. The power device of claim 2 wherein said defect responsive automatic disabling means comprises a fusible link.

5. The power device of claim 4 wherein said fusible link is configured to melt in response to a short circuit current in the associated individual devices, to thereby electrically disconnect the associated individual devices from said common electrode.

6. The power device of claim 4 wherein said plurality of individual devices comprise a plurality of MOS-gated cells, each having a source, a drain and a gate, the sources of said plurality of individual cells being connected together and the drains of said plurality of individual cells being connected together; wherein said common electrode comprises a common gate electrode; and wherein said plurality of fusible links are connected between said common gate electrode and an associated at least one of said gates of said individual devices, each of said fusible links being configured for melting in response to a short circuit between the associated gate and source or drain.

7. The power device of claim 1 wherein the at least one of said associated individual devices comprises a cell block of individual devices electrically connected in parallel.

8. The power device of claim 1 wherein said individual devices are selected from the group consisting of MOSFETS, IGBTs and MCTs.

9. The power device of claim 1 wherein said defect responsive automatic disabling means comprises an electronic logic circuit.

10. A power device comprising:
    an integrated circuit;
    a plurality of cell blocks, each containing an array of individual cells electrically connected in parallel, each array of individual cells comprising at least one individual device for passing a relatively small current so that said plurality of cell blocks, electrically connected in parallel, pass a relatively large current, to thereby provide an integrated circuit power device;

a fusible link electrically connected to each cell block each of said fusible links being configured for melting in response to a defect in the connected cell; and a common control electrode adjacent to each cell block and electrically connected to each fusible link;

whereby cell blocks containing defective individual cells are automatically disabled.

11. The power device of claim 10 wherein said individual cells are selected from the group consisting of MOSFETs, IGBTs and MCTs.

12. The power device of claim 10 wherein each of said cell blocks comprises a plurality of MOS cells, each having a source, a drain, and a gate, the sources of said plurality of cells being connected together, the drains of said plurality of cells being connected together, and the gates of said plurality of cells being connected together; wherein said common control electrode comprises a power device gate electrode; and wherein a fusible link is connected between said power device gate electrode and the gates of each cell block each of said fusible links being configured for melting in response to a short circuit between the gate and the source or drain in the associated cell block.

* * * * *